US012640340B2

(12) United States Patent
Kim

(10) Patent No.: US 12,640,340 B2
(45) Date of Patent: May 26, 2026

(54) SCANNING ELECTRON MICROSCOPE (SEM) MEASUREMENT METHOD AND APPARATUS

(71) Applicant: Samsung Electronics Co., Ltd., Suwon-si (KR)

(72) Inventor: Kihyun Kim, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 569 days.

(21) Appl. No.: 18/301,568

(22) Filed: Apr. 17, 2023

(65) Prior Publication Data

US 2024/0079206 A1 Mar. 7, 2024

(30) Foreign Application Priority Data

Sep. 5, 2022 (KR) ........................ 10-2022-0112376

(51) Int. Cl.
*H01J 37/28* (2006.01)
*H01J 37/22* (2006.01)

(52) U.S. Cl.
CPC ............ *H01J 37/28* (2013.01); *H01J 37/222* (2013.01); *H01J 2237/2817* (2013.01)

(58) Field of Classification Search
CPC .... H01J 37/222; H01J 37/28; H01J 2237/226; H01J 2237/2817; H01J 2237/2816; H01J 2237/2811; G06T 7/00; G06T 7/001; G06T 7/0004; G06T 7/11; G06T 7/30; G06T 7/174; G03F 7/70625; G03F 7/705; G03F 7/70441

See application file for complete search history.

(56) References Cited

U.S. PATENT DOCUMENTS

| 7,053,371 | B2 | 5/2006 | Ojima et al. |
| 7,518,110 | B2 | 4/2009 | Sutani et al. |
| 8,196,068 | B2 | 6/2012 | Zhang |
| 9,715,724 | B2 | 7/2017 | Schwarzband et al. |

(Continued)

FOREIGN PATENT DOCUMENTS

WO WO-2011108402 A1 * 9/2011 ............. G01B 15/04

OTHER PUBLICATIONS

Weisbuch, et al. "Enabling scanning electron microscope contour-based optical proximity correction models," Journal of Micro/Nanolithography, MEMS, and MOEMS, 14(2), pp. 021105-021105-11 (2015).

*Primary Examiner* — Wyatt A Stoffa
*Assistant Examiner* — Hsien C Tsai
(74) *Attorney, Agent, or Firm* — Fish & Richardson P.C.

(57) ABSTRACT

There are provided a scanning electron microscope (SEM) measurement method and/or apparatus that reduce critical dimension (CD) dispersion according to position correction of a measurement area in CD measurement in several SEM images of the same pattern. The SEM measurement method includes obtaining individual SEM images at a plurality of locations on a wafer via an SEM, generating a merged SEM image by aligning the individual SEMs and merging the individual SEM images, generating a merged measurement area in the merged SEM image, generating, in the individual SEM images, individual measurement areas corresponding to the merged measurement area, and measuring individual critical dimensions (CDs) in the individual measurement areas.

16 Claims, 16 Drawing Sheets

(56)     References Cited

U.S. PATENT DOCUMENTS

| | | |
|---|---|---|
| 10,697,900 B2 | 6/2020 | Zhang et al. |
| 10,962,886 B2 | 3/2021 | Van Der Laan et al. |
| 2013/0010100 A1 | 1/2013 | Kotaki et al. |
| 2018/0275521 A1* | 9/2018 | Wallow ................. G03F 7/7065 |
| 2022/0084220 A1 | 3/2022 | Pillai et al. |

* cited by examiner

MBm

SCANNING ELECTRON MICROSCOPE (SEM) MEASUREMENT METHOD AND APPARATUS

CROSS-REFERENCE TO RELATED APPLICATION

This application is based on and claims priority under 35 U.S.C. § 119 to Korean Patent Application No. 10-2022-0112376, filed on Sep. 5, 2022, in the Korean Intellectual Property Office, the disclosure of which is incorporated by reference herein in its entirety.

BACKGROUND

Various example embodiments relate to a method and/or an apparatus for measuring a semiconductor device, and in particular, to a scanning electron microscope (SEM) measurement method and/or apparatus for measuring a semiconductor device by using an SEM.

SEMs are a type of electron microscope that generates an SEM image by scanning the surface of a sample through electron beam irradiation. In a semiconductor process, devices and/or wiring patterns formed on a semiconductor substrate such as a wafer are photographed with such an SEM, and a critical dimension (CD) is measured in an SEM image obtained through the photographing. In general, the CD measurement using the SEM is performed for the same pattern at multiple locations on a wafer, and individual CDs are measured from SEM images at multiple locations to obtain a representative CD for the pattern.

SUMMARY

Various example embodiments provide a scanning electron microscope (SEM) measurement method and/or apparatus that reduces critical dimension (CD) dispersion according to position correction of a measurement area in CD measurement in several SEM images of the same pattern.

However, the technical goals to be achieved by the inventive concept are not limited to the technical goals mentioned above, and other technical goals may be clearly understood by one of ordinary skill in the art from the following descriptions.

According to various example embodiments, there is provided an SEM measurement method including obtaining individual SEM images at a plurality of locations on a wafer via an SEM, generating a merged SEM image by aligning the individual SEM images and by merging the individual SEM images, generating a merged measurement area in the merged SEM image, generating, in the individual SEM images, individual measurement areas corresponding to the merged measurement area, and measuring individual critical dimensions (CDs) in the individual measurement areas.

Alternatively or additionally according to various example embodiments, there is provided an SEM measurement method including obtaining individual SEM images at a plurality of locations on a wafer via an SEM, generating a merged SEM image by aligning the individual SEM images and merging the individual SEM images, generating a merged measurement area in the merged SEM image, correcting the merged measurement area in response to there being an error in a position of the merged measurement area, generating, in the individual SEM images, individual measurement areas corresponding to the merged measurement area, measuring individual critical dimensions (CDs) in the individual measurement areas, and predicting a representative CD by using the individual CDs.

Alternatively or additionally, there is provided an SEM measurement apparatus including an SEM configured to obtain individual SEM images at a plurality of locations on a wafer, a processor configured to execute machine readable instructions that, when executed by the processor, cause the SEM measurement apparatus to receive the individual SEM images and generate a merged SEM image by aligning and merging the individual SEM images, to receive the merged SEM image, to generate a merged measurement area in the merged SEM image, to generate individual measurement areas corresponding to the merged measurement area in the individual SEM images, and to measure individual critical dimensions (CDs) in the individual measurement areas.

BRIEF DESCRIPTION OF THE DRAWINGS

Various example embodiments will be more clearly understood from the following detailed description taken in conjunction with the accompanying drawings in which.

DETAILED DESCRIPTION OF VARIOUS EXAMPLE EMBODIMENTS

Figure 1:
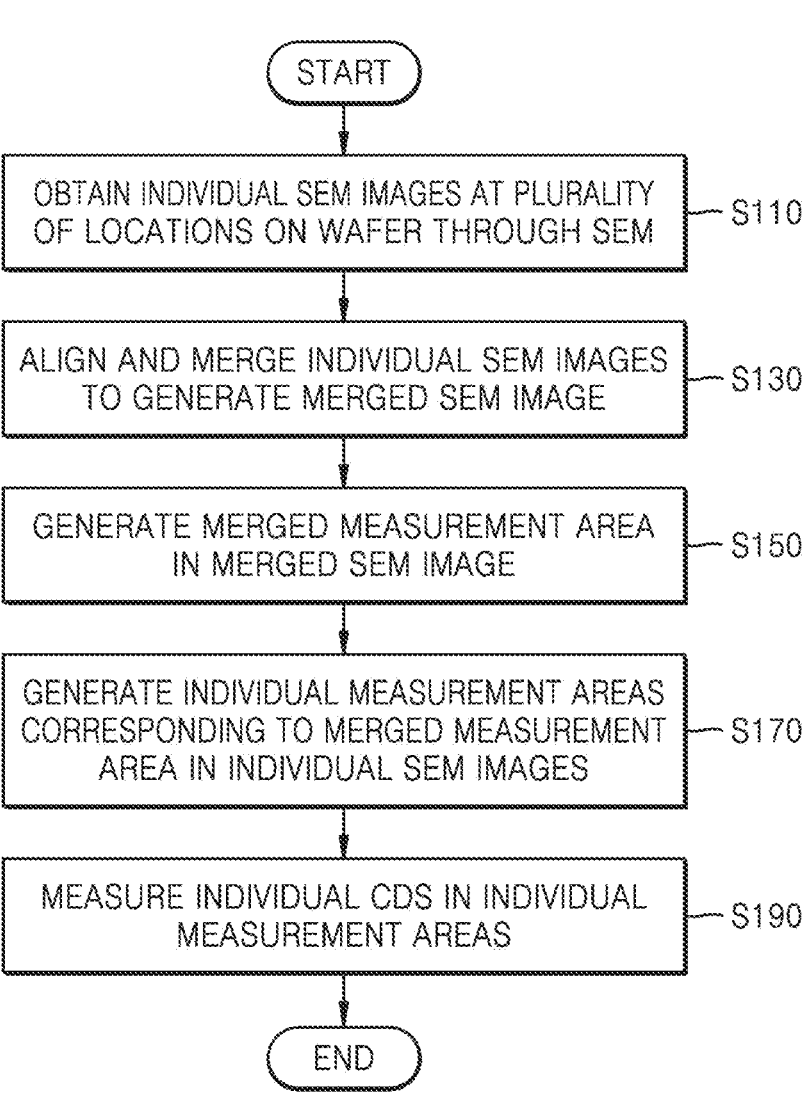
FIG. 1 is a schematic flowchart illustrating a process of a scanning electron microscope (SEM) measurement method according to various example embodiments.

Hereinafter, some example embodiments will be described in detail with reference to the accompanying drawings. The same reference numerals are used for the same components in the drawings, and duplicate descriptions thereof are omitted.

Figure 2A:
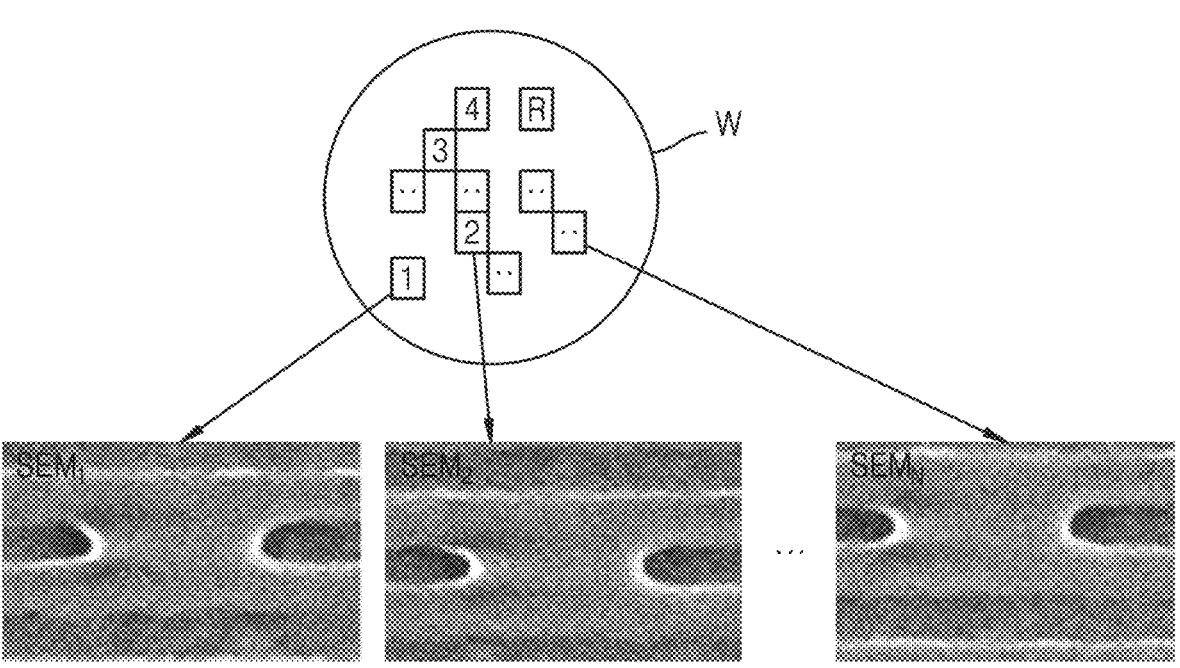
FIGS. 2A to 2E are SEM pictures for explaining each operation of FIG. 1.
Figure 2B:
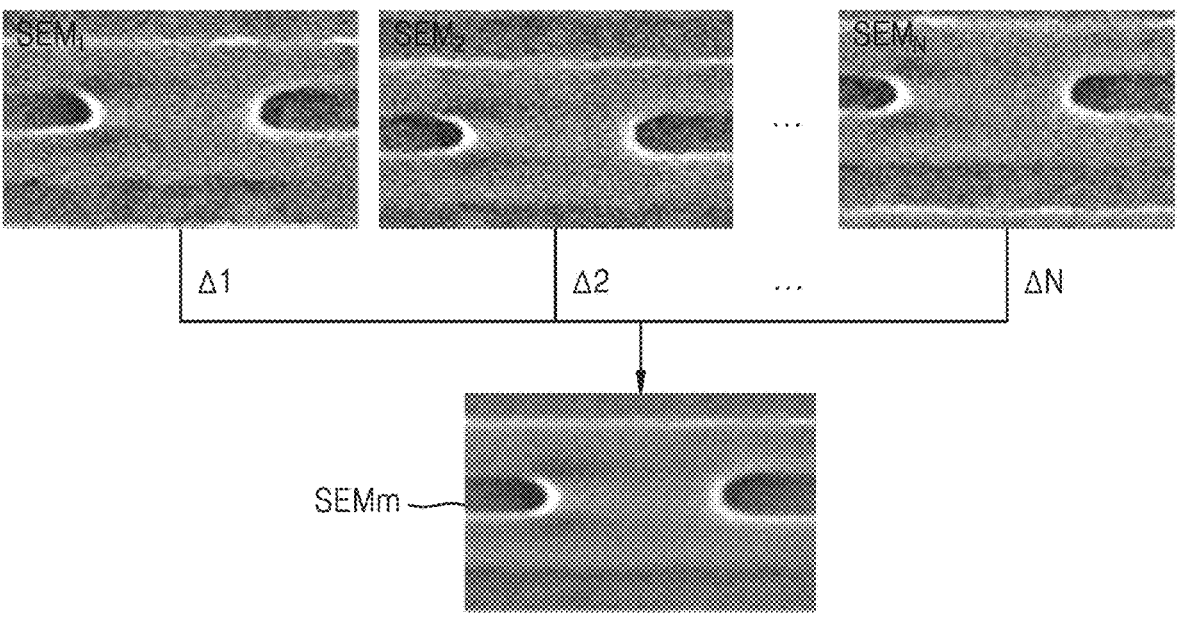
Figure 2C:
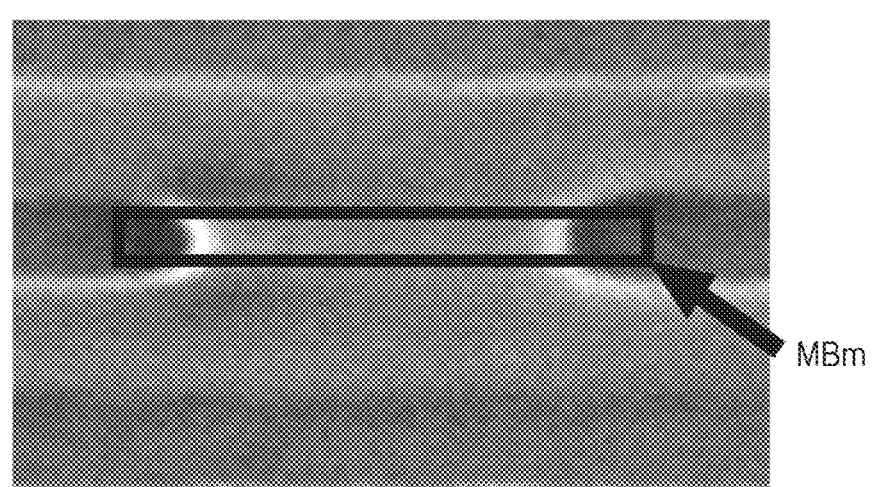
Figure 2D:
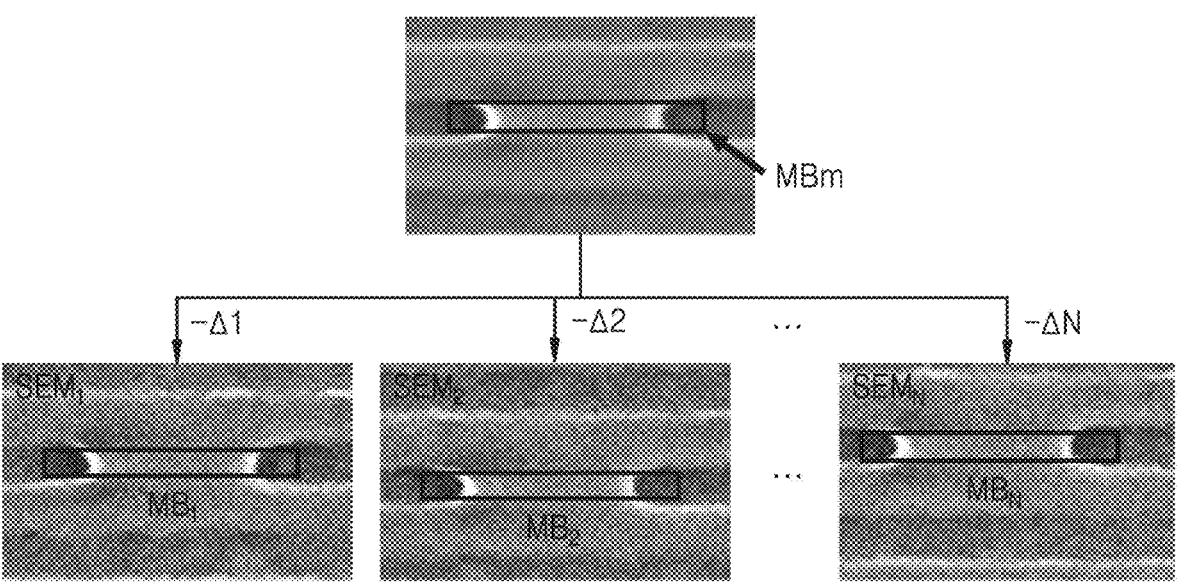
Figure 2E:
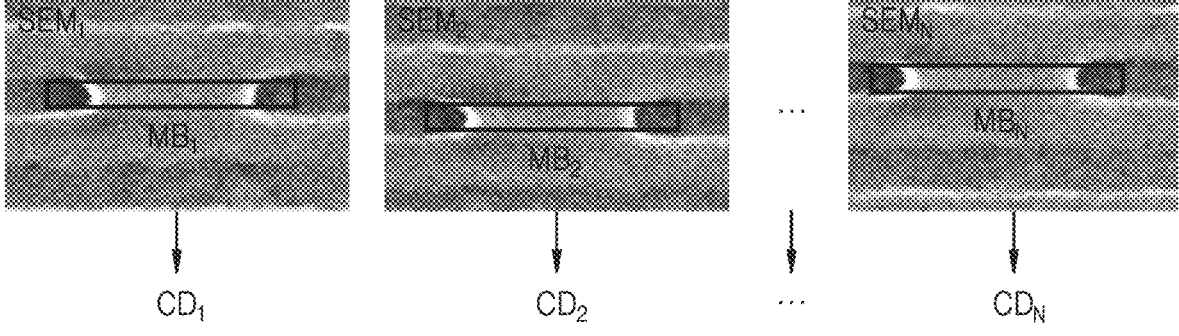
Figure 3:
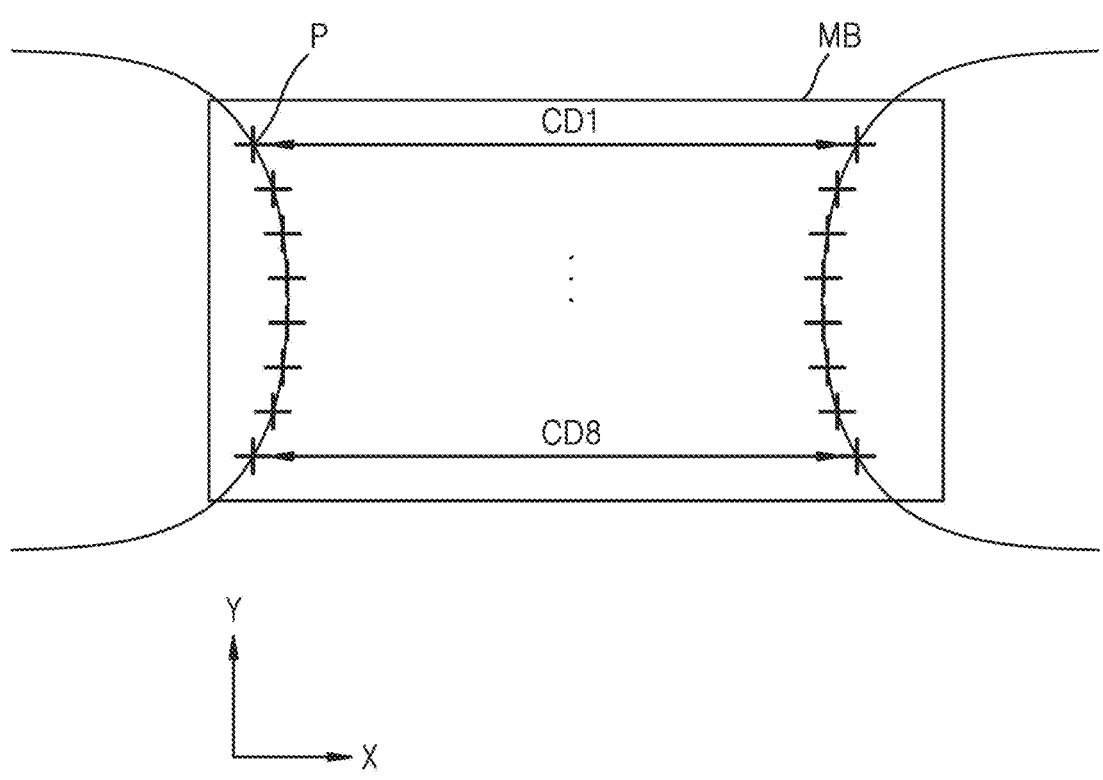
FIG. 3 is a conceptual diagram for explaining a measurement box corresponding to a merged measurement area of FIG. 2C.

FIG. 1 is a schematic flowchart illustrating a process of a scanning electron microscope (SEM) measurement method according to various example embodiments, FIGS. 2A to 2E are SEM pictures for explaining each operation of FIG. 1, and FIG. 3 is a conceptual diagram for explaining a measurement box MB corresponding to a merged measurement area of FIG. 2C.

Referring to FIGS. 1 and 2A, in the SEM measurement method according to various example embodiments, first, individual SEM images $SEM_1$, $SEM_2$, . . . , and $SEM_N$ are obtained at a plurality of locations on a wafer W by an SEM (operation S110). The wafer W may be or may include a silicon bulk wafer or an epitaxial wafer. The epitaxial wafer may include a crystalline material layer grown on a bulk wafer by an epitaxial process, for example, an epitaxial layer. However, the wafer W is not limited to a bulk wafer or an epitaxial wafer. For example, the wafer W may include various types of wafers, such as a polished wafer, an annealed wafer, and a silicon on insulator (SOI) wafer. A diameter of the wafer W may be 150 mm, or may be 200 mm, or may be 300 mm, or may be 450 mm; however, example embodiments are not limited thereto.

The wafer W may include a plurality of semiconductor chips or semiconductor dice. The wafer W may be separated or diced into individual semiconductor chips through a subsequent singulation/saw process. The semiconductor chips may include the same patterns constituting a semiconductor device. A pattern on the wafer W or semiconductor chip may be formed through a series of semiconductor processes, such as a photolithography process and/or an etching process and/or a deposition process.

In order to form a pattern on a wafer, a photolithography process using a mask may be generally performed. In order to perform such a photolithography process, a mask may first be fabricated. A mask may be simply defined as a pattern transfer body in which a pattern shape of an opaque material is formed on a transparent base layer material. In order to manufacture a mask, after a layout for a required circuit pattern is designed, optical proximity correction (OPC) is performed on the layout for the pattern, and OPCed layout data is obtained and delivered to a mask manufacturing team as mask tape-out (MTO) design data. Details of an OPC method and a mask manufacturing method are described in more detail with reference to FIGS. 7 and 8.

An OPC model may be generated to perform OPC. A process of generating an OPC model is referred to as OPC modeling, and during such OPC modeling, the critical dimension (CD) of a pattern that is actually formed on a wafer may be used. Accordingly, an SEM image of the pattern formed on the wafer is obtained, and the CD of the pattern in the SEM image may be measured. As described above, the wafer W may include the same pattern at various positions corresponding to the semiconductor chips. Therefore, in order to increase the reliability of the measured CD, CDs may be measured in SEM images obtained at a plurality of locations, and a representative CD may be extracted and used for OPC modeling. For example, in the SEM measurement method according to various example embodiments, a number such as ten SEM images may be obtained at different locations of the wafer W for the same pattern. However, in the SEM measurement method according to various example embodiments, the number of SEM images obtained for the same pattern is not limited to ten, and may be greater than or less than ten.

Even when CDs for the same pattern are measured, there may be differences, such as differences in noise, image shape, etc. for each SEM image, and thus, the measurement position of the CD may not be constant. In a case of a line & space pattern, the CD may hardly be affected by the measurement location, but in the case of a two-dimensional (2D) pattern, such as a line end, a contact, or a via, when the measurement location changes even slightly, the CD changes. Therefore, in the case of CD measurement of a 2D pattern, it is necessary or desirable to eliminate or reduce CD dispersion by measurement positions. Here, the 2D pattern may correspond to most of the patterns except for the line & space pattern, which is a one-dimensional (1D) pattern. For example, the 2D pattern may include a circular or polygonal pattern, such as a contact or a via, or a pattern, such as a line end.

In FIG. 2A, a process of obtaining the SEM images $SEM_1$, $SEM_2$, . . . , and $SEM_N$ at a plurality of locations 1 to N of the wafer W is shown. For reference, in FIG. 2A, a position indicated by R may correspond to a position where a reference SEM image is obtained. In other words, the position indicated by R may be the position of a reference SEM image that does not move when generating a merged SEM image later. The position of the reference SEM image may be set, e.g. may be arbitrarily set, for example by a user. In FIG. 2A, the SEM images $SEM_1$, $SEM_2$, . . . , and $SEM_N$ may include patterns of both ends of two lines adjacent to each other. Therefore, the SEM images $SEM_1$, $SEM_2$, . . . , and $SEM_N$ of FIG. 2A may be used to measure the CD of the tip-to-tip of lines. However, the SEM measurement method according to various example embodiments are not limited to the measurement of the CD of the tip-to-tip of lines.

Referring to FIGS. 1 and 2B, after the individual SEM images $SEM_1$, $SEM_2$, . . . , and $SEM_N$ are obtained, the individual SEM images $SEM_1$, $SEM_2$, . . . , and $SEM_N$ are aligned and merged to generate a merged SEM image SEMm (operation S130). The alignment of the individual SEM images $SEM_1$, $SEM_2$, . . . , and $SEM_N$ may use a cross-correlation coefficient. The cross-correlation coefficient is a calculation formula used for optical signal alignment, and how similar two signals are in form may be numerically calculated through the cross-correlation coefficient. In some example embodiments the more similar the two signals are, the higher the cross-correlation coefficient may be. In order to align the individual SEM images $SEM_1$, $SEM_2$, . . . , and $SEM_N$, a peak signal-to-noise ratio (PSNR) may be used similarly to the cross-correlation coefficient. For example, when the individual SEM images $SEM_1$, $SEM_2$, . . . , and $SEM_N$ are not aligned or are not significantly aligned, a lot of noise is included therein and a PSNR value is low, and when the individual SEM images $SEM_1$, $SEM_2$, . . . , and $SEM_N$ are aligned or are more aligned, the noise is reduced and the PSNR value is high.

As can be seen in FIG. 2B, when generating a merged SEM image SEMm, the remaining individual SEM images $SEM_1$, $SEM_2$, . . . , and $SEM_N$ excluding the reference SEM image may be moved. Therefore, for the SEM images $SEM_1$, $SEM_2$, . . . , and $SEM_N$, motion vector values $\Delta i$ may be calculated. Here, when the number of SEM images $SEM_1$, $SEM_2$, . . . , and $SEM_N$ is N, i may be an integer from 1 to N. Because the reference SEM image does not move, motion vector values $\Delta i$ for the remaining individual SEM images $SEM_1$, $SEM_2$, . . . , and $SEM_N$ excluding the reference SEM image may be calculated. A motion vector value $\Delta R$ (where R is an integer from 1 to N) of the reference SEM image may be 0.

More specifically, alignment may correspond to a process of moving and matching an SEM image to the reference SEM image. For example, in the case of the first SEM image $SEM_1$, the alignment of the first SEM image $SEM_1$ may refer to a process of moving the first SEM image $SEM_1$ by an x displacement ($\Delta x$) in an x-axis and by a y displacement ($\Delta y$) in a y-axis so that the first SEM image $SEM_1$ matches the reference SEM image. Therefore, a motion vector value $\Delta 1$ of the first SEM image $SEM_1$ may be expressed as ($\Delta x$, $\Delta y$). In some example embodiments, a total displacement $\Delta$ may be calculated from both $\Delta x$ and $\Delta y$, for example based on the Pythagorean theorem as the square root of Δx squared plus Δy squared; however, example embodiments are not limited thereto, and in some example embodiments, a total displacement Δ may be calculated as a sum of Δx and Δy and/or a maximum of Δx and Δy.

Referring to FIGS. 1, 2C, and 3, after the merged SEM image SEMm is generated, a merged measurement area MBm is generated in the merged SEM image SEMm (operation S150). The merged measurement area MBm may be generated in various ways. For example, the merged measurement area MBm may be generated using a measurement area generation processor or generation tool that automatically generates a measurement area. For example, a measurement area is generally automatically generated by applying the measurement area generation tool to individual SEM images. The measurement area generation tool may be applied to the merged SEM image SEMm to generate the merged measurement area MBm. For reference, the measurement area generation tool may automatically generate a measurement area by comparing a computer-aided design (CAD) image on a design for a pattern with an SEM image. Because the merged SEM image SEMm is also an SEM image, the measurement area generation tool may compare the CAD image to the merged SEM image SEMm to generate the merged measurement area MBm.

In the SEM measurement method according to various example embodiments, the method of generating the merged measurement area MBm is not limited to the method using the measurement area generation tool. For example, the merged measurement area MBm may be generated by applying a user processor or user tool for generating a measurement area according to a predetermined rule to the merged SEM image SEMm. Also, a processor and/or the user may visually view the merged SEM image SEMm and manually and/or automatically generate the merged measurement area MBm.

FIG. 3 shows an enlarged measurement box MB corresponding to a measurement area generated by the measurement area generation tool. The measurement box MB may have a quadrangular shape and may be generated as follows. In an SEM image, when pixels P are allocated to the boundaries of patterns, the measurement box MB may be generated to include a number, e.g. a set number of pixels in a width direction (y direction). For example, as shown in FIG. 3, eight pixels P may be set in the width direction (y direction). However, the number of pixels P in the width direction (y direction) is not limited to eight. The measurement box MB may be generated to include an outermost pixel P in a length direction (x direction). By generating the measurement box MB in the SEM image in this way, it is possible to generate a measurement area in the SEM image. Similarly, a merged measurement area MBm may be generated by generating the measurement box MB on a merged SEM image SEMm.

Referring to FIGS. 1 and 2D, after the merged measurement area MBm is generated, in the individual SEM images $SEM_1$, $SEM_2$, . . . , and $SEM_N$, individual measurement areas $MB_1$, $MB_2$, . . . , and $MB_N$ corresponding to the merged measurement area MBm are generated (operation S170). The individual measurement areas $MB_1$, $MB_2$, . . . , and $MB_N$ may be generated, e.g. may be easily generated by applying the reciprocals or negatives $-\Delta i$ of the motion vector values $\Delta i$ of the individual SEM images $SEM_1$, $SEM_2$, . . . , and $SEM_N$ to the merged measurement area MBm. As a more specific example and solely for the purposes of explaining and not for limitations, the coordinates of the center of the merged measurement area MBm in the merged SEM image SEMm may be (Xm, Ym) and the motion vector value of the first SEM image $SEM_1$ may be (0.1, −0.3). In this case, the reciprocal or the negative of the motion vector value of the first SEM image $SEM_1$ is (−0.1, 0.3), and the coordinates of the center of the first measurement area $MB_1$ in the first SEM image $SEM_1$ may be (Xm−0.1, Ym+0.3). Therefore, in the first SEM image $SEM_1$, the first measurement area $MB_1$ having center coordinates of (Xm−0.1, Ym+0.3) may be generated or directly generated. For reference, the merged measurement area MBm and the individual measurement areas $MB_1$, $MB_2$, . . . , and $MB_N$ may have the same size.

Referring to FIGS. 1, 2E, and 3, after the individual measurement areas $MB_1$, $MB_2$, and $MB_N$ are generated, individual CDs $CD_1$, $CD_2$, . . . , and $CD_N$ are respectively measured in the individual measurement areas $MB_1$, $MB_2$, . . . , and $MB_N$ (operation S190). The individual CDs $CD_1$, $CD_2$, . . . , and $CD_N$ may be measured as follows. In FIG. 3, a distance between two pixels P corresponding to each other in the length direction (x direction) within the measurement box MB may correspond to CD. Therefore, when a number such as eight pixels P are arranged in the width direction (y direction), eight CDs CD1 to CD8 may be calculated in the measurement box MB, and an average of the eight CDs CD1 to CD8 may correspond to an individual CD for a pattern within a corresponding measurement area. The average may be or may be based on an arithmetical mean and/or a mode and/or a median and/or some other measure of central tendency; example embodiments are not limited thereto.

Thereafter, a representative CD for a corresponding pattern may be predicted using individual CDs, and the representative CD may be used for OPC modeling. Prediction of the representative CD will be described in more detail with reference to FIG. 4.

The SEM measurement method according to various example embodiments includes generating a merged SEM image SEMm for a plurality of individual SEM images $SEM_1$, $SEM_2$, . . . , and $SEM_N$ obtained at various locations on a wafer W, and generating a merged measurement area MBm from the merged SEM image SEMm. In addition, the SEM measurement method according to various example embodiments further includes generating individual measurement areas $MB_1$, $MB_2$, . . . , and $MB_N$ from the individual SEM images $SEM_1$, $SEM_2$, . . . , and $SEM_N$ by applying the reciprocals of motion vector values of the individual SEM images $SEM_1$, $SEM_2$, . . . , and $SEM_N$ to the merged measurement area MBm, and measuring individual CDs $CD_1$, $CD_2$, . . . , and $CD_N$ in the individual measurement areas $MB_1$, $MB_2$, . . . , and $MB_N$. Therefore, in the SEM measurement method according to various example embodiments, a representative CD of a corresponding pattern may be more accurately predicted by measuring the individual CDs $CD_1$, $CD_2$, . . . , and $CD_N$ in the individual SEM images $SEM_1$, $SEM_2$, . . . , and $SEM_N$ through the method described above. Alternatively or additionally, by using such a representative CD for OPC modeling, the reliability of the OPC modeling may be improved. In some example embodiments, a semiconductor device may be fabricated based on the merged measurement area MBm and the individual measurement areas $MB_1$, $MB_2$, . . . , and $MB_N$.

The SEM measurement method according to various example embodiments is not limited to measurement of individual CDs applied to OPC modeling or prediction of a representative CD. For example, the SEM measurement method according to various example embodiments may also be used to measure the CDs of elements and/or wiring lines on a general wafer or semiconductor chip, and the semiconductor chip may be fabricated based on the measured CDs.

For reference, unlike in the SEM measurement method according to various example embodiments, when individual CDs are measured directly from individual SEM images without generating a merged SEM image, a measurement area is generated in each of the individual SEM images, and the position of the measurement area is corrected for each individual SEM image. Due to the process of correcting the position of each individual measurement area, position dispersion of CDs may occur, and it may take a lot of time to correct the position of the measurement area for each individual SEM image. On the other hand, in the SEM measurement method according to various example embodiments, position dispersion of CDs may be eliminated or reduced through the generation of the merged SEM image SEMm and the merged measurement area MBm, and because only the position correction of the merged measurement area MBm needs to be or is performed, the time for position correction of the measurement area may be significantly reduced. Position correction of the measurement area will be described in more detail with reference to FIGS. 4 to 5B below.

Figure 4:
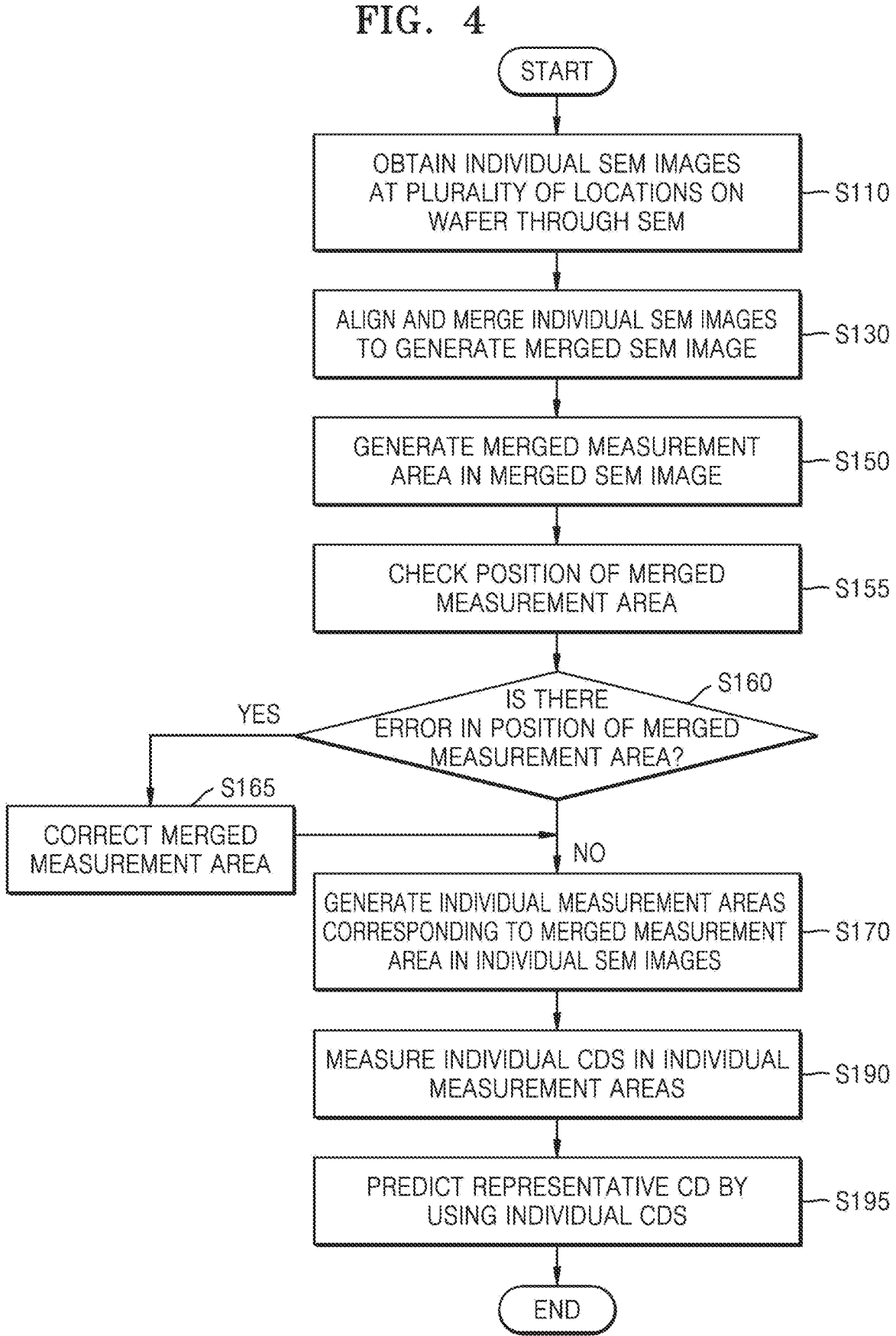
FIG. 4 is a schematic flowchart illustrating a process of an SEM measurement method according to various example embodiments.
Figure 5A:
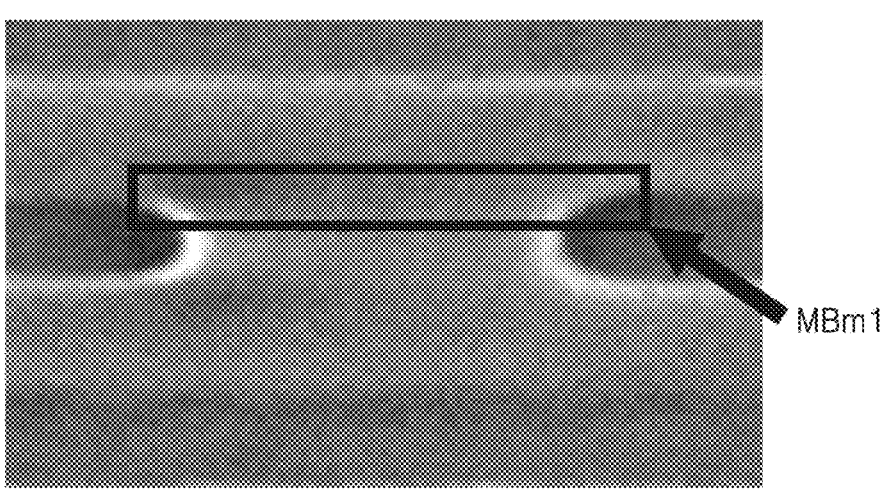
FIGS. 5A and 5B are pictures for explaining an operation of generating a merged measurement area and an operation of correcting the merged measurement area in FIG. 4.
Figure 5A:
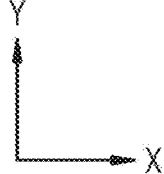
Figure 5B:
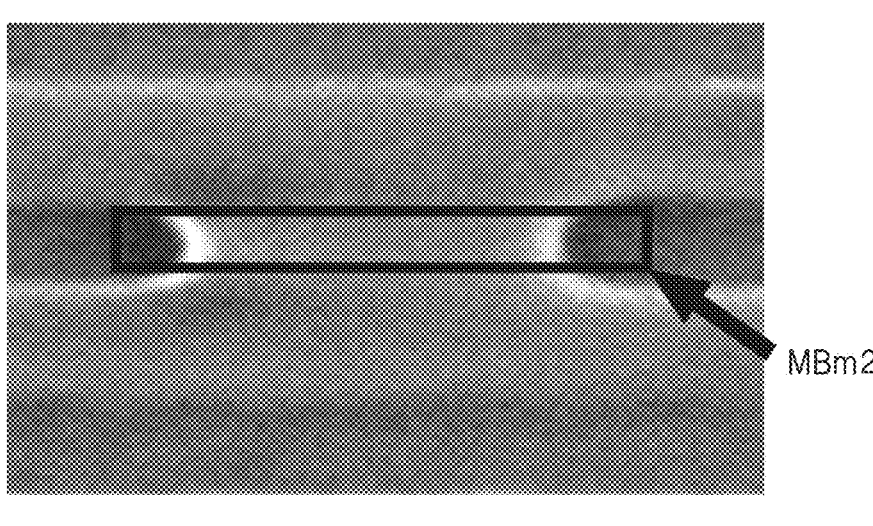
Figure 5B:
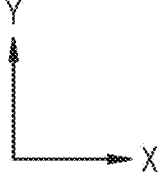

FIG. 4 is a schematic flowchart illustrating a process of an SEM measurement method according to various example embodiments, and FIGS. 5A and 5B are pictures for explaining an operation of generating a merged measurement area and an operation of correcting the merged measurement area in FIG. 4. Descriptions already given with reference to FIGS. 1 to 3 will be briefly provided or omitted.

Referring to FIG. 4, the SEM measurement method of FIG. 4 may differ from the SEM measurement method of FIG. 1 in that the SEM measurement method of FIG. 4 further includes checking the position of a merged measurement area and correcting the merged measurement area when there is an error. More specifically, the SEM measurement method according to various example embodiments includes obtaining individual SEM images (operation S110), generating a merged SEM image (operation S130), and generating a merged measurement area (operation S150), like the SEM measurement method of FIG. 1. The specific details of the obtaining individual SEM images (operation S110), the generating a merged SEM image (operation S130), and the generating a merged measurement area (operation S150) are the same as those given in the description of the SEM measurement method of FIG. 1.

Referring to FIGS. 4 and 5A, the position of a merged measurement area MBm1 is checked (operation S155). In case of using a measurement area generation processor or tool and/or a user processor or tool, when the merged measurement area MBm1 is first generated, there may be an error in the position of the merged measurement area MBm1. For example, the merged measurement area MBm1 may be positioned to include both line ends, but may be generated biased upward or downward in a width direction (y direction), as shown in FIG. 5A. Alternatively or additionally, the merged measurement area MBm1 may be generated in a form including only one line end among both line ends in a length direction (x direction). As such, when there is an error in the position of the merged measurement area MBm1, the position of the merged measurement area MBm1 needs to be corrected.

Referring to FIGS. 4 and 5B, when there is an error in the position of the merged measurement area MBm1 (YES), the merged measurement area MBm1 is corrected (operation S165). For example, as shown in FIG. 5A, when the merged measurement area MBm1 is generated biased in the width direction (y direction), the position of the merged measurement area MBm1 may be corrected in the width direction (y direction), and thus, as shown in FIG. 5B, a corrected merged measurement area MBm2 may be generated. Correction of the merged measurement area MBm1 may be performed by applying a correction processor or correction tool, which automatically corrects a measurement area according to a rule such as a dynamically determined rule and/or a predetermined rule, to the merged measurement area MBm1. In addition, a processor and/or user may visually view and determine the merged measurement area MBm1 and automatically and/or manually correct the position of the merged measurement area MBm1.

Thereafter, generating individual measurement areas (operation S170) is performed. In addition, when there is no error in the position of the merged measurement area MBm1 (NO), generating individual measurement areas (operation S170) is performed. Subsequently, measuring individual CDs (operation S190) is performed. The generating of the individual measurement areas (operation S170) and the measuring of the individual CDs (operation S190) are the same as those described with reference to FIG. 1.

After the individual CDs are measured, representative CD is predicted using the individual CDs (operation S195). The representative CD may be obtained, for example, by arithmetic averaging and/or weighted averaging of the individual CDs. For example, when CDs of a pattern appear almost similar across the entire wafer W, a representative CD may be calculated and predicted by arithmetic averaging of individual CDs. Due to the characteristics of a photolithography and/or etching process, when the CD of a pattern is different between a first portion, e.g. a central portion, of the wafer W and a second portion, e.g. an outer portion of the wafer W, the representative CD may be calculated and predicted by applying a weighted average to the individual CDs. The representative CD is not limited to arithmetic or weighted averaging of individual CDs. For example, the representative CD may be obtained through other averaging methods or statistical methods other than or in addition to averaging.

The SEM measurement method according to various example embodiments may eliminate or reduce position dispersion of CDs by uniformly or more uniformly correcting the position of a measurement area in individual SEM images through generation of a merged SEM image, generation of a merged measurement area MBm1, and generation of a corrected merged measurement area MBm2. Alternatively or additionally, because the position correction of the merged measurement area MBm1 only needs to be performed once, the time for position correction of the measurement area may be greatly reduced.

Specifically, for example, it is assumed that, for the same pattern, the time for generating a measurement area and/or merged measurement area and performing position correction of the measurement area and/or merged measurement area is a review time and a number such as ten SEM images are obtained to measure individual CDs. For the SEM images, in the case of an SEM measurement method according to a comparative example in which measurement areas are generated and the positions of the measurement areas are corrected, when the review time of one measurement area is T1, the total review time may be 10×T1. On the other hand, in the case of the SEM measurement method according to various example embodiments, the review time of the merged measurement area MBm1 is also T1, and because position correction is performed only for the merged measurement area MBm1 once, the total review time is still T1. Therefore, the SEM measurement method according to various example embodiments may reduce the total review time to ¹⁄₁₀ compared to the SEM measurement method according to the comparative example. As another example, when it is assumed that one person reviews 4,000 SEM images per day in the SEM measurement method according to the comparative example, 40,000 SEM images per day may be reviewed in the SEM measurement method according to various example embodiments.

For reference, in the case of generating the merged measurement area MBm1 or individual measurement areas in the SEM measurement method according to various example embodiments, the merged measurement area MBm1 or individual measurement areas are automatically generated by a measurement area generation tool and reflection of the reciprocals of motion vector values, and thus, it may only take a very short time. In addition, even in the SEM measurement method according to the comparative example, because a measurement area is automatically generated by a measurement area generation tool, it may take only a very short time. Therefore, the total review time of the SEM measurement method according to various example embodiments may be determined by the position correction time of the merged measurement area MBm1, and the total review time of the SEM measurement method according to the comparative example may be determined by the position correction time of measurement areas.

Figure 6A:
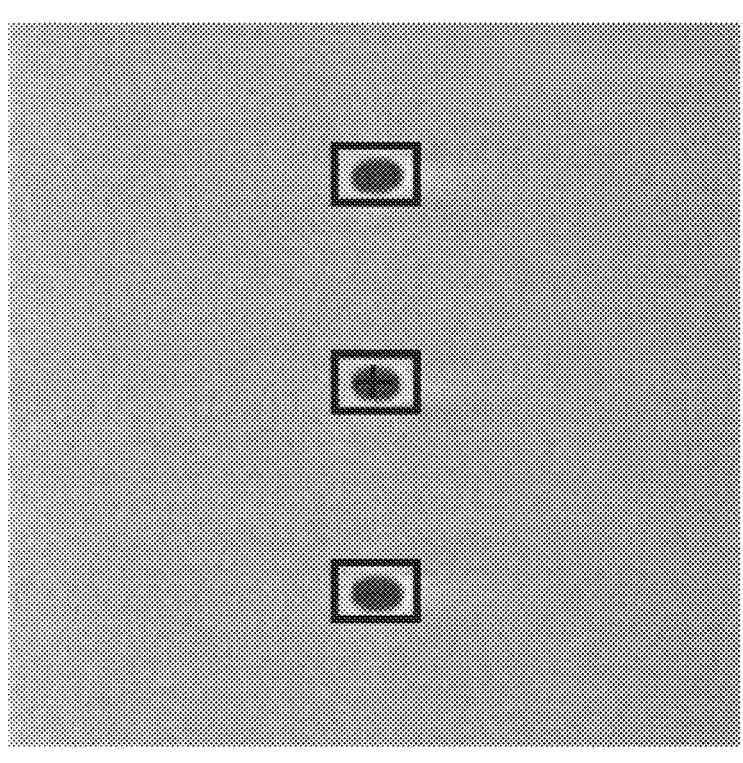
FIGS. 6A and 6B are an SEM picture and a graph for comparing an SEM measurement method according to various example embodiments and an SEM measurement method according to a comparative example.
Figure 6B:
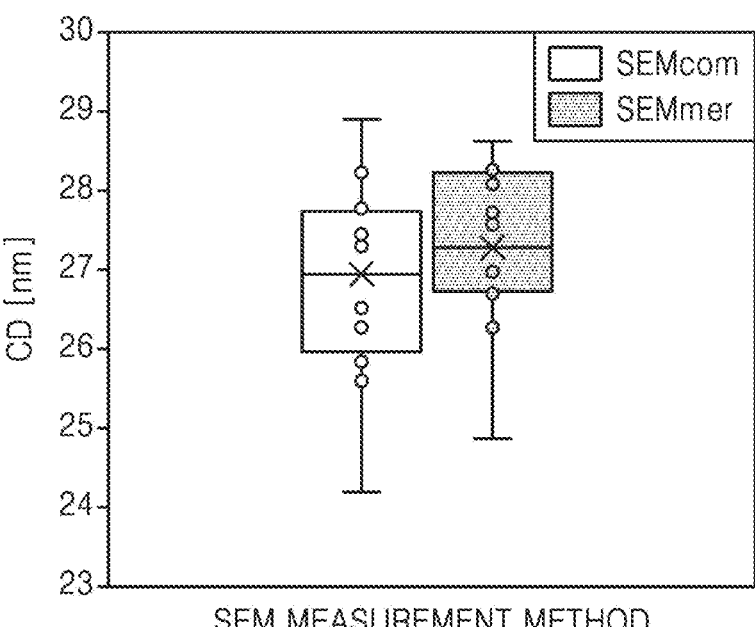

FIGS. 6A and 6B are an SEM picture and a graph for comparing the SEM measurement method according to various example embodiments versus the SEM measurement method according to the comparative example. The SEM picture of FIG. 6A is an SEM picture of a contact, and a square enclosing a black circle may correspond to a measurement area. The graph of FIG. 6B is a 4 quartile dispersion graph, where the x-axis of the graph represents the type of SEM measurement method and the y-axis of the graph represents CD with units of nm.

Referring to FIGS. 6A and 6B, as shown in the graph, it may be determined that the SEM measurement method SEMmer according to various example embodiments has a smaller dispersion/variance than the SEM measurement method SEMcom according to the comparative example. Also, assuming that the median of the 4 quartile dispersion graph corresponds to a representative CD, the representative CD by the SEM measurement method SEMmer according to various example embodiments may be greater than the representative CD by the SEM measurement method SEMcom according to the comparative example. In the case of the SEM measurement method SEMcom according to the comparative example, it may be analyzed that the representative CD is calculated to be less than an actual CD due to CD dispersion according to positions.

Figure 7:
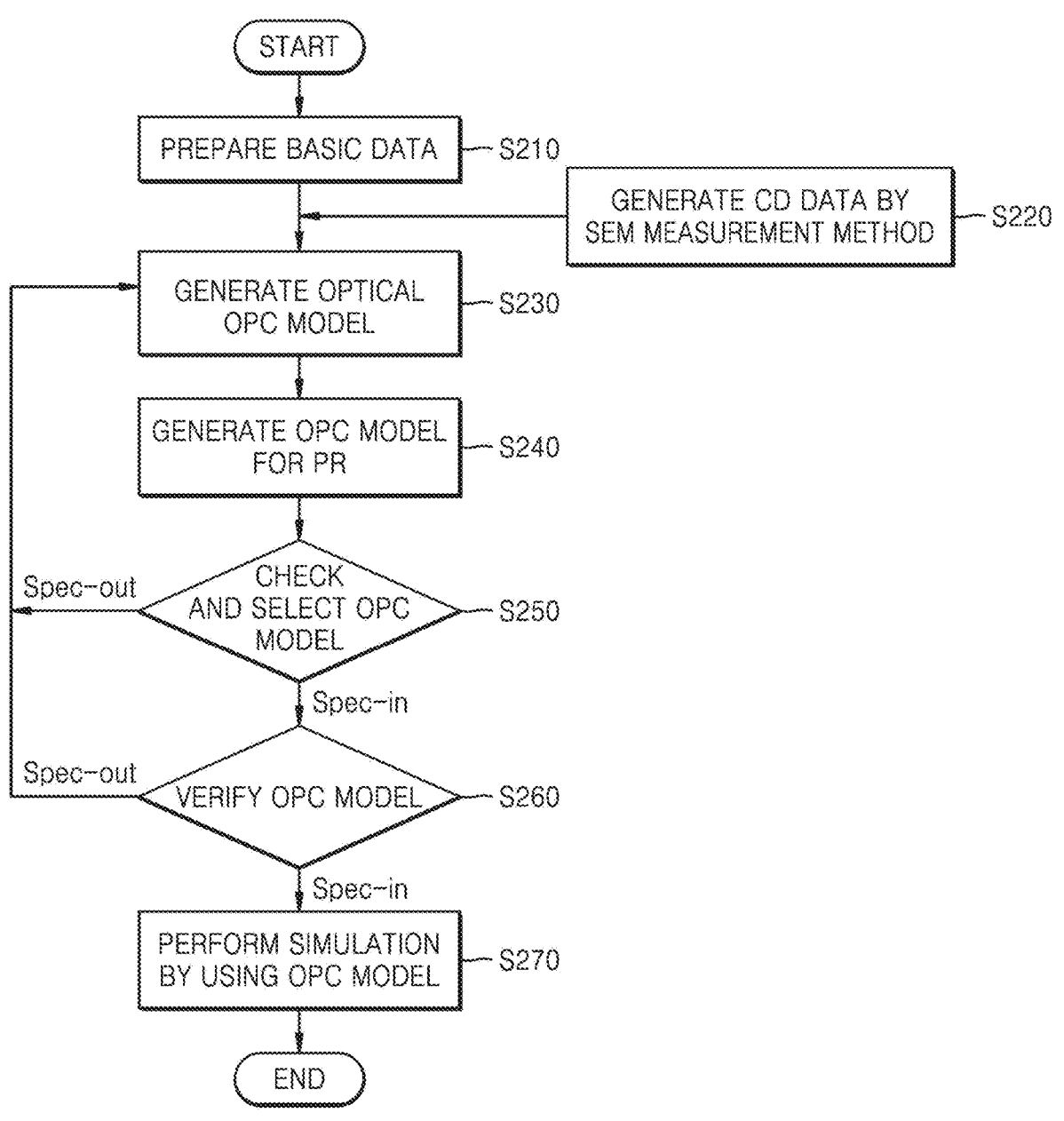
FIG. 7 is a schematic flowchart illustrating a process of an optical proximity correction (OPC) method using an SEM measurement method according to various example embodiments.

FIG. 7 is a schematic flowchart illustrating a process of an OPC method using an SEM measurement method according to various example embodiments. The process of the OPC method will be described with reference to FIG. 7 and FIGS. 1 to 2E, and descriptions already given with reference to FIGS. 1 to 6 will be briefly described or omitted.

Referring to FIG. 7, in the OPC method using the SEM measurement method according to various example embodiments, first, basic data for OPC is prepared (operation S210). Here, the basic data may include data about the shapes of patterns of a sample, the positions of the patterns, the type of measurement, such as measurement of a space or line of each of the patterns, and a basic measurement value. In addition, the basic data may include information, such as one or more of thickness, refractive index, and dielectric constant for photo resist (PR), and may include a source map for the form of an illumination system. However, the basic data is not limited to the data exemplified above.

For reference, as patterns are reduced in size or miniaturized, an optical proximity effect (OPE) due to an effect between neighboring patterns occurs during an exposure process, and the OPC method refers to a method of suppressing or reducing the occurrence of the OPE by correcting the layout of a pattern in order to overcome the OPE. The OPC method may be classified into two methods, and one of the two methods is a rule-based OPC method and the other is a simulation-based or model-based OPC method. The OPC method according to various example embodiments may be, for example, a model-based OPC method. The model-based OPC method may have some advantages in terms of time and cost because the model-based OPC method uses only measurement results of representative patterns without the need or expectation to measure all of the large number of test patterns.

The OPC method may include a method of adding sub-lithographic features called serifs onto the corners of a pattern, and/or a method of adding sub-resolution assist features (SRAFs), such as scattering bars and/or outriggers, as well as the correction of the layout of the pattern. Here, serifs are generally quadrangular features placed on each corner of a pattern, and may be used to "sharpen" the corners of the pattern or to compensate for distortion factors caused by intersections of the pattern. The SRAF is an auxiliary feature introduced to solve or at least partially solve an OPC deviation problem due to a difference in pattern density, and is formed to have a size less than the resolution of exposure equipment and is not transferred to a resist layer.

Next, CD data is generated by the SEM measurement method (operation S220). The SEM measurement method may be, for example, the SEM measurement method of FIG. 1. Accordingly, the SEM measurement method may include obtaining individual SEM images (operation S110), generating a merged SEM image (operation S130), generating a merged measurement area (operation S150), generating individual measurement areas (operation S170), and measuring individual CDs (operation S190). CD data by the SEM measurement method may be data for a representative CD predicted using individual CDs. A representative CD may be calculated through arithmetic or weighted averaging of the individual CDs. However, the calculation of the representative CD is not limited to the arithmetic or weighted averaging of the individual CDs.

The SEM measurement method may be, for example, the SEM measurement method of FIG. 4. Accordingly, the SEM measurement method may include obtaining individual SEM images (operation S110), generating a merged SEM image (operation S130), generating a merged measurement area (operation S150), checking the position of the merged measurement area (operation S155), determining whether there is an error in the position of the merged measurement area (operation S160), correcting the merged measurement area (operation S165), generating individual measurement areas (operation S170), measuring individual CDs (operation S190), and predicting a representative CD (operation S195). In the predicting of the representative CD (operation S195), the representative CD may be calculated through arithmetic and/or weighted averaging of individual CDs. However, the calculation of the representative CD is not limited to the arithmetic or weighted averaging of the individual CDs.

The preparing of the basic data (operation S210) and the generating of the CD data by the SEM measurement method (operation S220) may not be limited in the order of execution. For example, the preparing of the basic data (operation S210) may be performed first, or the generating of the CD data by the SEM measurement method (operation S220) may be performed first.

After basic data preparation and CD data generation, an optical OPC model is generated (operation S230). The generating of the optical OPC model may include improving upon or optimizing a defocus stand (DS) position, a best focus (BF) position, and the like in an exposure process. In addition, the generating of the optical OPC model may include improving upon or optimizing the diffraction phenomenon of light or the optical state of the exposure equipment itself. However, the generating of the optical OPC model is not limited to the above. For example, the generating of the optical OPC model may include various contents related to optical phenomena in an exposure process. In generating such an optical OPC model, CD data by the SEM measurement method described above may be used.

After the generating of the optical OPC model, an OPC model for PR is generated (operation S240). The generating of the OPC model for the PR may include improving upon or optimizing a threshold value of the PR. Here, the threshold value of the PR refers to a threshold value at which a chemical change occurs in an exposure process. For example, the threshold value may be given as the intensity of exposure light. The generating of the OPC model for the PR may also include selecting an appropriate model form from among several PR model forms. Here, the PR model form may be a composition of chemical properties of PR. For example, a first PR model form may include chemical properties 1, 2, and 3, and a second PR model form may include chemical properties 1, 3, and 4. Also in generating the OPC model for the PR, CD data of the sample described above may be used.

The optical OPC model and the OPC model for the PR are collectively referred to as the OPC model. Accordingly, both a process of generating the optical OPC model and a process of generating the OPC model for the PR may be collectively referred to as a process of generating the OPC model, that is, an OPC modeling process. Hereinafter, unless otherwise specified, the OPC model is used as a combination of the optical OPC model and the OPC model for the PR.

After the generating of the OPC model, the OPC model is checked and is selected (operation S250). The checking of the OPC model may be performed, for example, through root mean square (RMS) calculation for a CD error. Here, the CD error may refer to a difference between a CD calculated through the OPC model and a representative CD obtained through the SEM measurement method described above. After the checking of the OPC model, the OPC model is selected. More specifically, first, an RMS value for the CD error is calculated for the generated OPC model, and it is checked whether the calculated RMS value is within, e.g. is less than, a set specification. When the calculated RMS value is within the set specification (Spec-in), the OPC model is selected. When the calculated RMS value is out of specification (Spec-out), the OPC model is discarded, and a process of generating an OPC model again is performed by moving to the generating of the OPC model, for example, the generating of the optical OPC model (operation S230).

When the OPC model is selected, the OPC model is verified (operation S260). The verification of the OPC model may be accomplished through application of the OPC model to patterns other than those used to generate the OPC model. When the OPC model is applied to other patterns and substantially the same result is obtained (Spec-in), the verification of the OPC model is completed. When the same result is not obtained (Spec-out), a process of generating an OPC model again is performed by moving to the generating of the OPC model, that is, the generating of the optical OPC model (operation S230).

When the verification of the OPC model is completed, simulation is performed using the OPC model (operation S270). Through simulation using such an OPC model, OPCed layout data for a pattern may be obtained. Thereafter, the OPCed layout data may be transmitted to a mask manufacturing team as MTO design data for mask manufacturing.

The OPC method according to various example embodiments may improve the accuracy of the OPC model by generating CD data, in which CD dispersion according to positions is reduced by the SEM measurement method of FIG. 1 or 4, and using the CD data for OPC modeling, and accordingly may optimize the OPC method. In addition, the OPC method according to various example embodiments may significantly reduce review time and thus reduce CD data generation time by generating the CD data by using the SEM measurement method of FIG. 1 or 4. As a result, the total OPC time in the OPC method may be greatly reduced.

Figure 8:
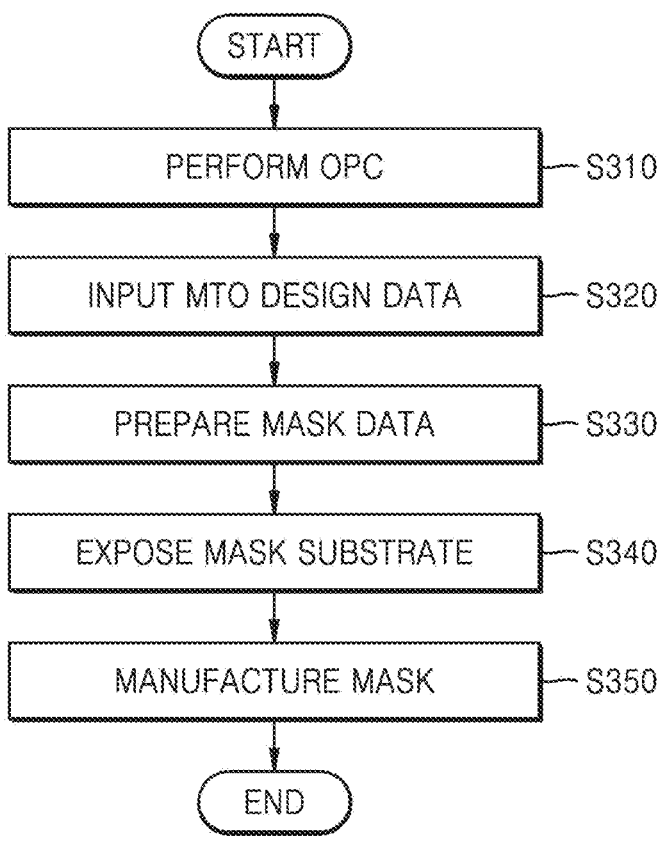
FIG. 8 is a schematic flowchart illustrating a process of a mask manufacturing method including an OPC method according to various example embodiments.

FIG. 8 is a schematic flowchart illustrating a process of a mask manufacturing method including an OPC method according to various example embodiments. The process of the mask manufacturing method will be described with reference to FIG. 8 and FIGS. 1 to 2E, and descriptions already given with reference to FIGS. 1 to 7 will be briefly described or omitted.

Referring to FIG. 8, the mask manufacturing method including the OPC method according to various example embodiments includes first performing OPC (operation S310). Here, the OPC may correspond to the OPC method of FIG. 7. Therefore, the performing of the OPC (operation S310) may include preparing basic data (operation S210), generating CD data by the SEM measurement method (operation S220), generating an OPC model (operations S230 and S240), checking and selecting the OPC model (operation S250), verifying the OPC model (operation S260), and performing a simulation (operation S270).

In addition, as described above with reference to FIG. 1, the generating of the CD data by the SEM measurement method (operation S220) may include obtaining individual SEM images (operation S110), generating a merged SEM image (operation S130), generating a merged measurement area (operation S150), generating individual measurement areas (operation S170), and measuring individual CDs (operation S190). In addition, as described above with reference to FIG. 4, the generating of the CD data by the SEM measurement method (operation S220) may include obtaining individual SEM images (operation S110), generating a merged SEM image (operation S130), generating a merged measurement area (operation S150), checking the position of the merged measurement area (operation S155), determining whether there is an error in the position of the merged measurement area (operation S160), correcting the merged measurement area (operation S165), generating individual measurement areas (operation S170), measuring individual CDs (operation S190), and predicting a representative CD (operation S195).

After the performing of the OPC, MTO design data is input (operation S330). In general, the MTO may refer to requesting or instructing mask manufacturing by handing over OPC-completed layout data, for example, OPCed layout data, to a mask manufacturing team or facility. Accordingly, the MTO design data may eventually correspond to the OPCed layout data. Such MTO design data may have a graphic data format used in electronic design automation (EDA) software or the like. For example, the MTO design data may have a data format, such as one or more of graphic data system II (GDS2), open artwork system interchange standard (OASIS), or the like.

After the inputting of the MTO design data, mask data preparation (MDP) is performed (operation S350). The MDP may include, for example, i) format conversion called fracturing, ii) augmentation of barcodes for machine reading, standard mask patterns for inspection, job decks, etc., and iii) automated and manual verification. Here, the job deck may refer to generating a text file related to a series of commands, such as arrangement information of multiple mask files, a standard dose, and an exposure speed or method.

The format conversion, i.e., the fracturing, may refer to a process of dividing MTO design data for each region and changing the format thereof into a format for an electron beam exposure machine. The fracturing may include, for example, data manipulation, such as scaling, data sizing, data rotation, pattern reflection, and color inversion. In a conversion process through the fracturing, data for numerous systematic errors that may occur somewhere during a transfer process from design data to an image on a wafer may be corrected. A data correction process for the systematic errors may be referred to as mask process correction (MPC), and may include, for example, line width control called CD control and an operation of increasing pattern placement precision. Therefore, the fracturing may contribute to improving the quality of a final mask and may be a pre-performed process for MPC. Here, the systematic errors may be caused by distortion generated in an exposure process, a mask development and etching process, a wafer imaging process, or the like.

The MDP may include MPC. As described above, the MPC refers to a process of correcting an error generated during an exposure process, for example, a systematic error. Here, the exposure process may be a process that generally includes electron beam writing, developing, etching, baking, and the like. Additionally, data processing may be performed prior to the exposure process. The data processing is a type of pre-processing of mask data, and may include a grammar check on mask data, an exposure time prediction, and the like.

After the MDP, a mask substrate is exposed based on the mask data (operation S370). Here, the exposure may refer to, for example, electron beam writing. The electron beam writing may be performed in a gray writing method using, for example, a multi-beam mask writer (MBMW). Also, the electron beam writing may be performed using a variable shape beam (VSB) exposure machine.

After the MDP operation, a process of converting the mask data into pixel data may be performed before the exposure process. The pixel data is data directly used for actual exposure and may include data on shapes to be exposed and data on a dose allocated to each of the shapes. Here, the data on the shapes may be bit-map data obtained by converting shape data, which is vector data, through rasterization or the like.

After the exposure process, a mask is manufactured by performing a series of processes (operation S390). The series of processes may include, for example, developing, etching, and cleaning processes. In addition, the series of processes for mask manufacturing may include a measurement process and a defect inspection or defect repair process. In addition, the series of processes may include a pellicle application process. Here, the pellicle application process may refer to a process of attaching a pellicle to a mask surface to protect or at least partially protect the mask from subsequent contamination during the delivery and service life of the mask when it is confirmed that there are no contaminant particles and/or no chemical stains through final cleaning and inspection.

The mask manufacturing method according to various example embodiments may improve the accuracy of the OPC model by generating CD data, in which CD dispersion according to positions is reduced by the SEM measurement method of FIG. 1 or 4, and using the CD data for OPC modeling, and accordingly may optimize the OPC method to allow fabrication of superior masks with improved reliability. In addition, the mask manufacturing method according to various example embodiments may reduce review time and thus reduce CD data generation time by generating the CD data by using the SEM measurement method of FIG. 1 or 4. As a result, the total OPC time of the OPC method may be greatly reduced, and also the manufacturing process time of the mask manufacturing method may be reduced.

Figure 9:
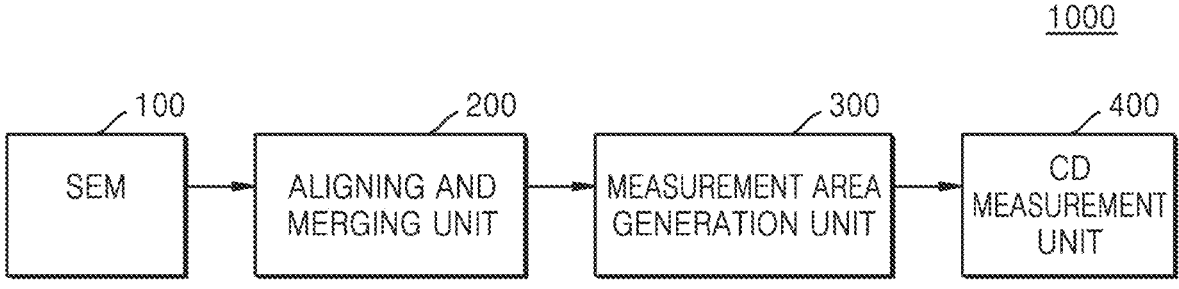
FIG. 9 is a block diagram of an SEM measurement apparatus according to various example embodiments.
Figure 10:
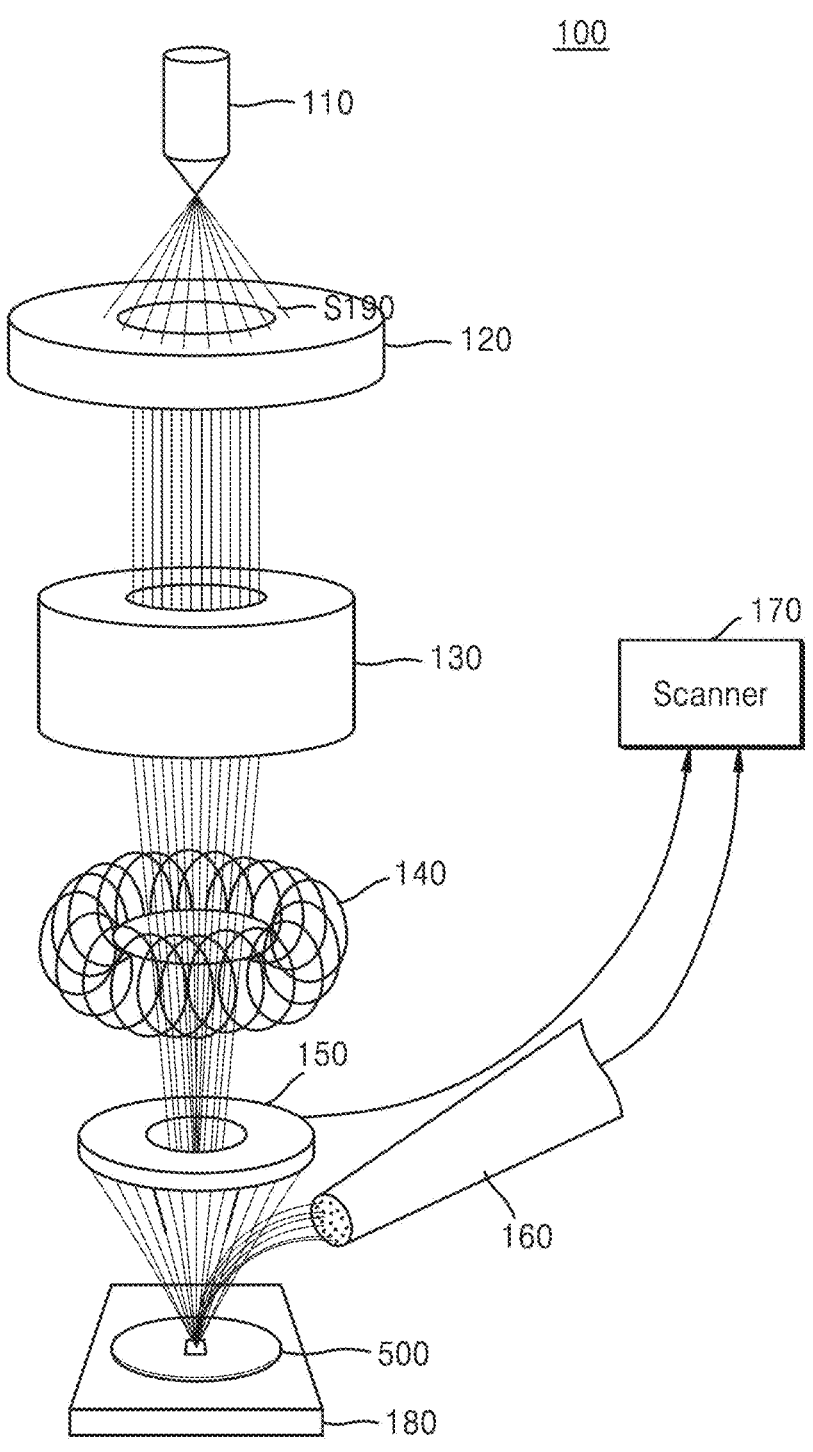
FIG. 10 is a schematic configuration diagram illustrating an SEM in the SEM measurement apparatus of FIG. 9.

FIG. 9 is a block diagram of an SEM measurement apparatus 1000 according to various example embodiments, and FIG. 10 is a schematic configuration diagram illustrating an SEM in the SEM measurement apparatus of FIG. 9. The SEM measurement apparatus 1000 according to various example embodiments will be described with reference to FIGS. 9 and 10 and FIGS. 1 to 2E, and descriptions already given with reference to FIGS. 1 to 6 will be briefly given or omitted.

Referring to FIGS. 9 and 10, the SEM measurement apparatus 1000 according to various example embodiments may include an SEM 100, an aligning and merging unit 200, a measurement area generation unit 300, and a CD measurement unit 400. Each of, or at least some of, the aligning and merging unit 200, the measurement area generation unit 300, and the CD measurement unit 400, may be implemented as a processor, such as one or more central processing units, such as a processor that is configured to execute machine readable instructions that, when executed by the processor, cause the SEM measurement apparatus 1000 to perform various functions. In some example embodiments, functions performed by any of the aligning and merging unit 200, the measurement area generation unit 300, and the CD measurement unit 400 may be performed by others of the aligning and merging unit 200, the measurement area generation unit 300, and the CD measurement unit 400; example embodiments are not limited thereto. In some example embodiments, each of or at least some of the aligning and merging unit 200, the measurement area generation unit 300, and the CD measurement unit 400 may correspond to one or more components of the machine readable instructions; example embodiments are not limited thereto.

The SEM 100 may obtain SEM images by photographing a required or desired pattern portion at various locations, e.g. variously determined and/or predetermined and/or dynamically determined, locations on a wafer. As shown in FIG. 10, the SEM 100 may include an electron gun 110, an anode 120, a magnetic lens 130, a scanning coil 140, a first detector 150, a second detector 160, a scanner 170, and a stage 180.

For example, as the electron gun 110, a Schottky type or thermal electric field emission type electron gun may be used. An electron beam may be emitted by applying an accelerating voltage to the electron gun 110. The anode 120 is an accelerating electrode, and the electron beam is accelerated by a voltage applied between the electron gun 110 and the anode 120. The magnetic lens 130 may function to focus and accelerate the electron beam. The scanning coil 140 may scan the electron beam one-dimensionally or two-dimensionally on a specimen, that is, a sample wafer 500.

The first detector 150 detects electrons that are back scattered when the electron beam is irradiated to the sample wafer 500, and the second detector 160 detects secondary electrons generated from the sample wafer 500 by the electron beam irradiation. The scanner 170 may generate an image of a PR pattern or wafer pattern on the sample wafer 500 by analyzing detection signals of electrons detected by the first and second detectors 150 and 160. In addition, the scanner 170 may apply a high-frequency control signal to the scanning coil 140 to control a scanning direction of the electron beams.

The stage 180 is where the sample wafer 500 is disposed, and the sample wafer 500 may be placed and supported on an upper surface of the stage 180. The stage 180 may move the sample wafer 500 in the x, y, or z direction through linear movement in the x, y, or z direction. Although not shown in the drawings, an objective lens may be disposed directly on the stage 180, and the objective lens may focus electron beams deflected by the scanning coil 140 onto the upper surface of the sample wafer 500.

The aligning and merging unit 200 may align individual SEM images $SEM_1$, $SEM_2$, . . . , and $SEM_N$ obtained at a plurality of locations on a wafer through the SEM 100 and form one merged SEM image SEMm. The alignment of the individual SEM images $SEM_1$, $SEM_2$, . . . , and $SEM_N$ may be performed using, for example, a cross-correlation coefficient.

The measurement area generation unit 300 generates a merged measurement area MBm from the merged SEM image SEMm. The measurement area generation unit 300 may automatically generate the merged measurement area MBm from the merged SEM image SEMm by using a measurement area generation tool or a user tool. The measurement area generation tool may automatically generate a measurement area by comparing a CAD image on a design for a pattern with an SEM image.

In addition, the measurement area generation unit 300 may generate individual measurement areas $MB_1$, $MB_2$, . . . , and $MB_N$ from the individual SEM images $SEM_1$, $SEM_2$, . . . , and $SEM_N$, based on the merged measurement area MBm. For example, the measurement area generation unit 300 may generate the individual measurement areas $MB_1$, $MB_2$, . . . , and $MB_N$ by applying the reciprocals $-\Delta i$ of the motion vector values $\Delta i$ of the individual SEM images $SEM_1$, $SEM_2$, . . . , and $SEM_N$ to the merged measurement area MBm.

The CD measurement unit 400 measures individual CDs $CD_1$, $CD_2$, . . . , and $CD_N$ in the individual measurement areas $MB_1$, $MB_2$, . . . , and $MB_N$ of the individual SEM images $SEM_1$, $SEM_2$, . . . , and $SEM_N$. The CD measurement unit 400 may obtain CDs between pixels as many as pixels set in the width direction (y direction) in each of the individual measurement areas $MB_1$, $MB_2$, . . . , and $MB_N$, and may obtain the individual CDs $CD_1$, $CD_2$, . . . , and $CD_N$ by averaging the CDs between the pixels.

In the SEM measurement apparatus 1000 according to various example embodiments, the aligning and merging unit 200, the measurement area generation unit 300, and the CD measurement unit 400 may be implemented by a computer device capable of executing a corresponding program or tool, for example, one or more of a general personal computer (PC), a workstation, or a supercomputer. In addition, in the SEM measurement apparatus 1000 according to various example embodiments, the aligning and merging unit 200, the measurement area generation unit 300, and the CD measurement unit 400 may be all implemented in one computer device, or may each be implemented in separate computer devices.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

While inventive concepts have been particularly shown and described with reference to embodiments thereof, it will be understood that various changes in form and details may be made therein without departing from the spirit and scope of the following claims. Furthermore, example embodiments are not necessarily mutually exclusive with one another. For example, some example embodiments may include one or more features described with reference to one or more figures and may also include one or more features described with reference to one or more other figures.

What is claimed is:

1. A scanning electron microscope (SEM) measurement method comprising:
    obtaining individual SEM images at a plurality of locations on a wafer via an SEM;
    generating a merged SEM image by aligning the individual SEM images and by merging the individual SEM images;
    generating a merged measurement area in the merged SEM image;
    generating, in the individual SEM images, individual measurement areas corresponding to the merged measurement area; and
    measuring individual critical dimensions (CDs) in the individual measurement areas.

2. The SEM measurement method of claim 1, wherein,
    in the generating of the merged SEM image, motion vector values ($\Delta i$) by which the individual SEM images move are calculated (where, when the individual SEM images include N SEM images, i is an integer from 1 to N), and
    in the generating of the individual measurement areas, the individual measurement areas are generated by applying negatives ($-\Delta i$) of the motion vector values ($\Delta i$) to the merged measurement area.

3. The SEM measurement method of claim 1, wherein alignment of the individual SEM images uses a cross-correlation coefficient.

4. The SEM measurement method of claim 1, wherein, in the generating of the merged measurement area, the merged measurement area is generated using a measurement area generation processor that automatically generates a measurement area.

5. The SEM measurement method of claim 4, wherein the measurement area generation processor automatically generates the measurement area by comparing a computer-aided design (CAD) image corresponding to the merged SEM image with the merged image.

6. The SEM measurement method of claim 1, further comprising:

correcting the merged measurement area in response to there being an error in a position of the merged measurement area, wherein, in the generating of the individual measurement areas, the individual measurement areas are generated from the corrected merged measurement area.

7. The SEM measurement method of claim 6, wherein, in the correcting of the merged measurement area, the merged measurement area is corrected using a correction processor that automatically corrects a measurement area.

8. The SEM measurement method of claim 1, wherein the merged measurement area or each of the individual measurement areas is defined as a two-dimensional measurement box (MB), wherein, in response to pixels being allocated to a boundary portion of a pattern, the two-dimensional MB has a quadrangular shape defined to include a number of pixels in a width direction and to include, from among the number of pixels, outermost pixels on both sides in a length direction.

9. The SEM measurement method of claim 8, wherein, in the measuring of the individual CDs, each of the individual CDs is measured by averaging distances between both pixels corresponding to each of the number of pixels.

10. The SEM measurement method of claim 1, further comprising:

after the measuring of the individual CDs, predicting a representative CD by using the individual CDs.

11. The SEM measurement method of claim 10, wherein the representative CD is obtained by arithmetical averaging and/or weighted averaging of the individual CDs.

12. A scanning electron microscope (SEM) measurement method comprising:

obtaining individual SEM images at a plurality of locations on a wafer via an SEM;

generating a merged SEM image by aligning and merging the individual SEM images;

generating a merged measurement area in the merged SEM image;

correcting the merged measurement area in response to there being an error in a position of the merged measurement area;

generating, in the individual SEM images, individual measurement areas corresponding to the merged measurement area;

measuring individual critical dimensions (CDs) in the individual measurement areas; and predicting a representative CD by using the individual CDs.

13. The SEM measurement method of claim 12, wherein, in the generating of the merged SEM image, motion vector values ($\Delta i$) by which the individual SEM images move are calculated (where, when the individual SEM images include N SEM images, i is an integer from 1 to N), and in the generating of the individual measurement areas, the individual measurement areas are generated by applying negatives ($-\Delta i$) of the motion vector values ($\Delta i$) to the merged measurement area.

14. The SEM measurement method of claim 12, wherein the alignment of the individual SEM images uses a cross-correlation coefficient, and in the generating of the merged measurement area, the merged measurement area is generated using a measurement area generation processor that automatically generates a measurement area.

15. The SEM measurement method of claim 12, wherein the merged measurement area or each of the individual measurement areas is defined as a two-dimensional measurement box (MB), wherein, in response to pixels being allocated to a boundary portion of a pattern, the two-dimensional MB has a quadrangular shape defined to include a number of pixels in a width direction and to include, from among the number of pixels, outermost pixels on both sides in a length direction.

16. The SEM measurement method of claim 12, wherein the representative CD is obtained by arithmetical averaging and/or weighted averaging of the individual CDs.

* * * * *